United States Patent
Wei et al.

(10) Patent No.: US 7,829,421 B2
(45) Date of Patent: Nov. 9, 2010

(54) SOI TRANSISTOR HAVING AN EMBEDDED STRAIN LAYER AND A REDUCED FLOATING BODY EFFECT AND A METHOD FOR FORMING THE SAME

(75) Inventors: Andy Wei, Dresden (DE); Thorsten Kammler, Ottendorf-Okrilla (DE); Jan Hoentschel, Dresden (DE); Manfred Horstmann, Duerrroehrsdorf-Dittersbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 68 days.

(21) Appl. No.: 11/563,986

(22) Filed: Nov. 28, 2006

(65) Prior Publication Data

US 2007/0252204 A1    Nov. 1, 2007

(30) Foreign Application Priority Data

Apr. 28, 2006  (DE) .................. 10 2006 019 937

(51) Int. Cl.
*H01L 21/336* (2006.01)
(52) U.S. Cl. ...................... 438/300; 257/E21.619; 257/E21.634
(58) Field of Classification Search .............. 438/300; 257/E21.619, E21.634
See application file for complete search history.

(56) References Cited

U.S. PATENT DOCUMENTS

| 6,395,587 | B1 | 5/2002 | Crowder et al. .......... 438/149 |
| 6,441,434 | B1 | 8/2002 | Long et al. ............... 257/347 |
| 6,867,428 | B1 | 3/2005 | Besser et al. ............. 257/19 |
| 6,872,626 | B1* | 3/2005 | Cheng ..................... 438/299 |
| 7,238,561 | B2* | 7/2007 | Zhang et al. ............. 438/197 |
| 7,238,580 | B2* | 7/2007 | Orlowski et al. ......... 438/300 |
| 2004/0053481 | A1* | 3/2004 | Chakravarthi et al. .... 438/514 |
| 2005/0082522 | A1 | 4/2005 | Huang et al. ............. 257/19 |
| 2005/0093021 | A1* | 5/2005 | Ouyang et al. ........... 257/194 |
| 2005/0110082 | A1 | 5/2005 | Cheng et al. ............. 257/341 |
| 2005/0112817 | A1 | 5/2005 | Cheng et al. ............. 438/219 |
| 2005/0287752 | A1 | 12/2005 | Nouri et al. .............. 438/303 |

(Continued)

FOREIGN PATENT DOCUMENTS

| WO | 2006/020282 | 2/2006 |
| WO | 2007/027473 | 3/2007 |

OTHER PUBLICATIONS

German Official Communication Dated May 22, 2007 for Application No. 102006019937.5-33.

(Continued)

*Primary Examiner*—Matthew C Landau
*Assistant Examiner*—Daniel Luke
(74) *Attorney, Agent, or Firm*—Williams, Morgan & Amerson, P.C.

(57) ABSTRACT

By forming a portion of a PN junction within strained silicon/germanium material in SOI transistors with a floating body architecture, the junction leakage may be significantly increased, thereby reducing floating body effects. The positioning of a portion of the PN junction within the strained silicon/germanium material may be accomplished on the basis of implantation and anneal techniques, contrary to conventional approaches in which in situ doped silicon/germanium is epitaxially grown so as to form the deep drain and source regions. Consequently, high drive current capability may be combined with a reduction of floating body effects.

8 Claims, 9 Drawing Sheets

U.S. PATENT DOCUMENTS

| | | | |
|---|---|---|---|
| 2006/0009001 A1* | 1/2006 | Huang et al. | 438/305 |
| 2006/0054968 A1* | 3/2006 | Lee | 257/327 |
| 2006/0065914 A1* | 3/2006 | Chen et al. | 257/288 |
| 2006/0068555 A1 | 3/2006 | Zhu et al. | 438/303 |

OTHER PUBLICATIONS

Search Report Dated Aug. 30, 2007 for Serial No. PCT/US07/007844.

* cited by examiner

SOI TRANSISTOR HAVING AN EMBEDDED STRAIN LAYER AND A REDUCED FLOATING BODY EFFECT AND A METHOD FOR FORMING THE SAME

BACKGROUND OF THE INVENTION

1. Field of the Invention

Generally, the present invention relates to the formation of integrated circuits, and, more particularly, to the formation of transistors having strained channel regions by using an embedded strained layer in the drain and source regions to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently one of the most promising approaches, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed near the channel region and separated therefrom by a thin insulating layer. The conductivity of the channel region, upon formation of a conductive channel, due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions raises a plurality of issues associated therewith that have to be addressed so as to not unduly offset the advantages obtained by steadily decreasing the channel length of MOS transistors. Since the continuous size reduction of the critical dimensions, i.e., the gate length of the transistors, necessitates the adaptation and possibly the new development of highly complex process techniques, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Therefore, in one approach, the hole mobility of PMOS transistors is enhanced by forming a strained silicon/germanium layer in the drain and source regions of the transistors, wherein the compressively strained drain and source regions create strain in the adjacent silicon channel region. To this end, the drain and source extension regions of the PMOS transistors are formed on the basis of ion implantation. Thereafter, respective sidewall spacers are formed at the gate electrode as required for the definition of the deep drain and source junctions and the metal silicide in a later manufacturing stage. Prior to the formation of the deep drain and source junctions, these regions are selectively recessed based on the sidewall spacers, while the NMOS transistors are masked. Subsequently, a highly doped silicon/germanium layer is selectively formed in the PMOS transistor by epitaxial growth techniques. Typically, the strained silicon/germanium is provided with a certain degree of "overfill" during the epitaxial growth in order to reduce the consumption of the desired strained silicon/germanium material during a silicidation process for forming a metal silicide in the drain and source regions for obtaining a reduced contact resistance. After the selective growth process and the formation of respective drain and source regions in the N-channel transistors on the basis of conventional implantation techniques, an anneal process is performed to activate dopants and re-crystallize implantation-induced damage. Moreover, during the anneal process, the dopants within the strained silicon/germanium layer are also diffusing, thereby forming respective PN junctions outside the strained silicon/germanium layer and within the adjacent silicon material.

Figure 1:
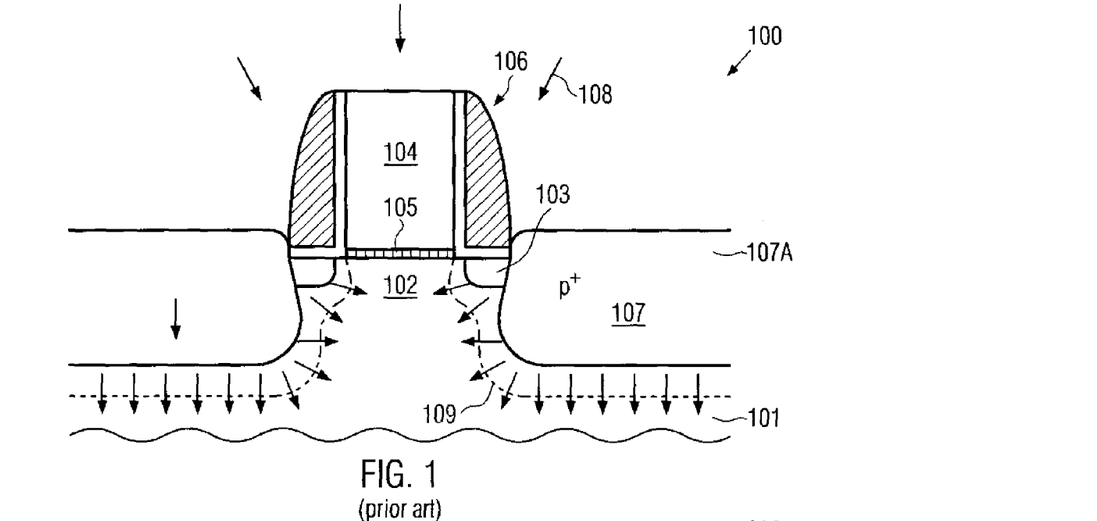
FIG. 1 schematically illustrates a P-channel transistor in a bulk configuration in cross-sectional view, wherein a strained silicon/germanium material is provided and respective PN junctions are formed by out-diffusing the P-type dopant, thereby positioning the respective PN junctions completely within silicon material according to conventional techniques.

FIG. 1 schematically illustrates a corresponding P-channel transistor 100 formed on a bulk substrate 101 during a respective anneal process 108. In this manufacturing stage, the transistor 100 may comprise a gate electrode 104 including a sidewall spacer structure 106 and formed on a gate insulation layer 105 that separates the gate electrode 104 from a body region 102 in which a conductive channel may build up when applying an appropriate control voltage to the gate electrode 104. Adjacent to the body region 102, extension regions 103 may be located that comprise a moderately high concentration of a P-type dopant. Next to the extension regions 103 are formed highly P-doped strained silicon/germanium regions 107.

The transistor 100 may be formed on the basis of well-established techniques as previously described. During the anneal process 108, the dopants in the extension regions 103 and in the strained regions 107 may diffuse, as indicated by the arrows, to finally obtain respective PN junctions 109 that are completely located within the silicon-based region 102.

Thereafter, a metal silicide (not shown) may be formed in the excess portions 107A of the strained silicon/germanium regions 107 and in the gate electrode 104 on the basis of well-established silicidation techniques.

This process technique may provide significant advantages for bulk devices where the respective cavities for receiving the strained silicon/germanium material may be etched deep into the silicon substrate and the PN junctions may be positioned within the silicon material, thereby providing low leakage junctions. However, it turns out that, for silicon-on-insulator (SOI) devices, this strategy may be less efficient, due to the limited thickness of the silicon layer and increased floating body effects when transistor architectures without additional body contacts are considered.

In view of the above-described situation, there exists a need for an improved technique for increasing the performance of SOI transistors by the use of strained semiconductor materials, while substantially avoiding or at least reducing one or more of the above-identified problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that provides enhanced performance of SOI transistors including a strained silicon/germanium material in the respective drain and source regions for creating a required strain in the channel region, wherein, in one aspect, the corresponding strained silicon/germanium material is located in close proximity to the gate electrode. Moreover, the effects of a floating body, as typically encountered in partially depleted SOI transistors without additional body contacts, may be significantly reduced by positioning a portion of the respective PN junctions within the strained silicon/germanium material, thereby increasing the respective junction leakage, since silicon/germanium has a valence band offset of approximately 100 millivolts compared to silicon, thereby increasing the respective body/drain/source diode current and thus junction leakage. Consequently, minority charge carriers, typically accumulating in the floating body, may be more efficiently discharged, thereby significantly reducing any threshold voltage variations. According to one aspect, PN junctions may be effectively formed in strained silicon/germanium material on the basis of implantation techniques, contrary to conventional techniques, in which, due to expected difficulties with respect to defect generation, the high dopant concentration for the drain and source regions is incorporated during a selective epitaxial growth process.

According to one illustrative embodiment of the present invention, a semiconductor device comprises a silicon-containing semiconductor layer formed on a buried insulating layer and a gate electrode formed above the silicon-containing semiconductor layer, wherein the gate electrode is separated therefrom by a gate insulation layer. The semiconductor device further comprises a sidewall spacer formed at a sidewall of the gate electrode and a strained silicon/germanium material that is formed in the semiconductor layer adjacent to the sidewall spacer. Moreover, a drain region and a source region are formed partially within the strained silicon/germanium material, wherein the drain region and the source region define a floating body region therebetween. The drain and source regions are formed so as to define respective PN junctions with the floating body region, wherein a portion of the PN junctions is located within the strained silicon/germanium material.

According to another illustrative embodiment of the present invention, a method comprises forming a recess adjacent to a gate electrode structure including a sidewall spacer within a semiconductor layer that is formed on a buried insulating layer. The method further comprises forming a strained silicon/germanium material in the recess. Furthermore, drain and source regions are formed adjacent to the gate electrode structure by an ion implantation process and an anneal process, wherein the drain and source regions define respective PN junctions with a floating body region and wherein the drain and source regions are formed such that a portion of the PN junctions is located within the strained silicon/germanium material.

According to yet another illustrative embodiment of the present invention, a method comprises forming a recess adjacent to a gate electrode structure including a sidewall spacer within a semiconductor layer that is formed on a buried insulating layer. Furthermore, a first strained silicon/germanium material is formed in the recess and thereafter a second strained silicon/germanium material comprising a P-type dopant material is formed on the first strained silicon/germanium material. Furthermore, drain and source extension regions are formed adjacent to the gate electrode structure by an ion implantation process and an anneal process is performed to define respective PN junctions with a floating body region, wherein a portion of the PN junctions is located within strained silicon/germanium material.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to silicon-on-insulator (SOI) transistor architectures with a floating body region, in which a highly efficient strain-inducing mechanism is provided in the form of embedded silicon/germanium material in a portion of the drain and source regions as well as in a portion of the floating body region. The drain and source regions are formed such that a portion of the respective PN junctions, i.e., the boundary between the floating body region and the highly P-doped drain and source regions, is within the strained silicon/germanium material. The resulting increased junction leakage (which is considered inappropriate for bulk devices) caused by the reduced band gap of silicon/germanium material compared to silicon material may provide an efficient leakage path for accumulated charge carriers in the floating body region, thereby significantly reducing corresponding operation-dependent potential variations, also referred to as hysteresis effects.

By appropriately designing the manufacturing process, that is, by controlling a respective etch process for forming a corresponding cavity or recess, appropriately selecting implantation parameters for a subsequent implantation process for forming the deep drain and source regions and appropriate anneal techniques, the area of the respective PN junctions provided within the strained silicon/germanium material may be efficiently adjusted, thereby also providing a control mechanism for adapting the required degree of junction leakage. Contrary to conventional teaching, stating that providing high dopant concentrations with a tolerable defect rate may have to be based on in situ doping of the strained silicon/germanium material, the implantation-based formation of PN junctions may thus enable a significant increase of junction leakage, thereby significantly reducing floating body effects while still maintaining improved drive current capability obtained by the provision of the strained silicon/germanium material. In still other embodiments, the performance increase of SOI transistors with a floating body region may still be increased by positioning the strained semiconductor material in close proximity to the channel region by using a disposable spacer, wherein the offset of the strained silicon/germanium material may be adjusted independently from other device requirements, such as the formation of a metal silicide in the drain and source regions. Consequently, the respective portion of the PN junction located within the strained silicon/germanium material may be even further increased, thereby providing the potential for reducing even further floating body effects. Furthermore, the strained silicon/germanium material may not necessarily be provided with an excess height for accommodating a metal silicide so as to not unduly relax the strained material in the vicinity of the channel region, as is the case in conventional techniques, since forming the metal silicide in the substantially planar configuration of the drain and source regions may still leave highly strained silicon/germanium material between the channel region and the metal silicide. Consequently, when a stressed overlayer may be provided above the respective metal silicide regions, a further enhanced stress transfer from the stressed overlayer into the respective channel region may be obtained.

Moreover, in some embodiments of the present invention, a portion of the respective PN junctions may be positioned within strained silicon/germanium material with reduced implantation-induced damage created in the strained silicon/germanium material by appropriately combining implantation sequences and doped and undoped epitaxial growth techniques of the strained silicon/germanium material.

Figure 2A:
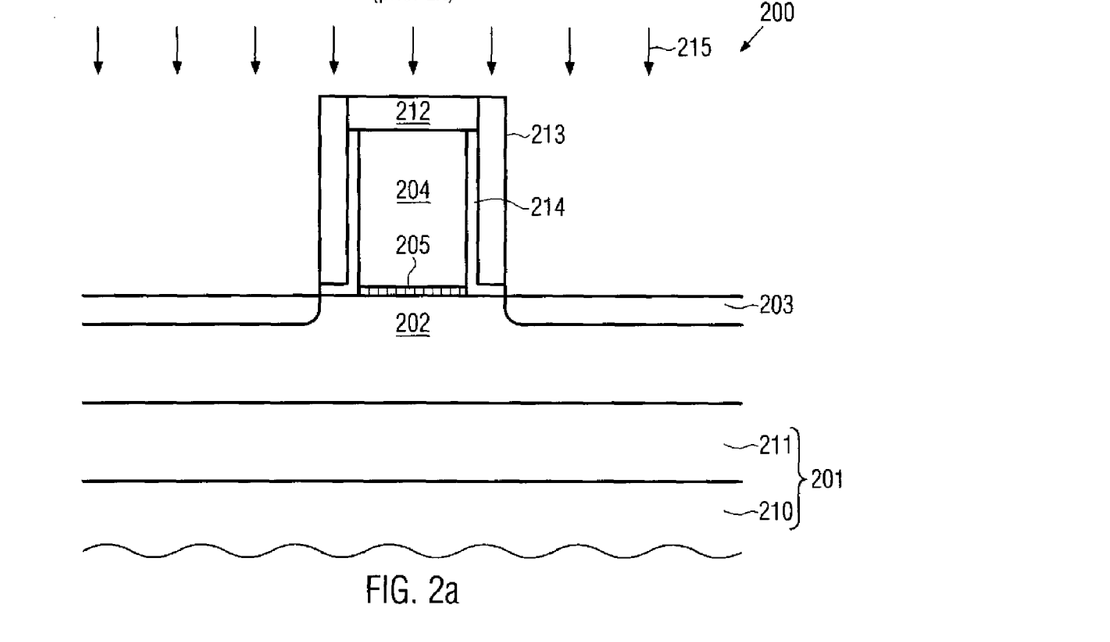
FIGS. 2a-2f schematically illustrate cross-sectional views of an SOI transistor with a floating body region during various manufacturing stages according to illustrative embodiments of the present invention, in which deep drain and source regions are formed by ion implantation.

With reference to the accompanying drawings, further illustrative embodiments of the present invention will now be described in more detail. FIG. 2a schematically illustrates in cross-sectional view a semiconductor device 200, which represents an SOI transistor with a floating body region. The transistor 200 may comprise, in this manufacturing stage, a substrate 201 including a base material 210 and formed thereon a buried insulating layer 211. For example, the substrate 201 may represent a silicon substrate, representing the base material 210, having formed thereon a silicon dioxide layer or any other appropriate insulating material as the buried insulating layer 211. Formed on the buried insulating layer 211 is a silicon-containing crystalline layer 202, wherein the silicon content may be 50 atomic percent silicon or more compared to any other components in the layer 202. The semiconductor layer 202 may have a thickness as required for the formation of partially or fully depleted SOI transistors, wherein, in some illustrative embodiments, a thickness of the semiconductor layer 202 may range from approximately 10-100 nm. Furthermore, a gate electrode 204 is formed above the semiconductor layer 202 and is separated therefrom by a gate insulation layer 205. For example, in one illustrative embodiment, the gate electrode 204 may be comprised, in this manufacturing stage, of polysilicon, doped or undoped, wherein a length of the gate electrode 204, i.e., in FIG. 2a, the horizontal extension of the gate electrode, may be approximately 100 nm and significantly less, for instance approximately 50 nm and less. The gate insulation layer 205 may represent any appropriate dielectric material, such as silicon dioxide, silicon nitride, high-k dielectric materials, combinations thereof and the like. The gate electrode 204 may have formed on its top surface a capping layer 212 which may, for instance, be comprised of silicon nitride or any other appropriate material. Moreover, a sidewall spacer structure comprising a spacer 213 and, if required, a liner 214 may be provided at sidewalls of the gate electrode 204. Respective implantation regions 203 with a moderately high concentration of a P-type dopant may be formed adjacent to the gate electrode 204 including the spacer structure 213 and may represent drain and source extension regions for deep drain and source regions still to be formed.

A typical process flow for forming the transistor 200 as shown in FIG. 2a may comprise the following processes. After providing the substrate 201, which may have formed thereon the silicon-containing layer 202, well-established manufacturing processes, including the formation of isolation structures (not shown) and establishing a specified vertical dopant profile in the layer 202, if required, may be performed. Thereafter, the gate electrode 204, the capping layer 202 and the gate insulation layer 205 may be patterned from respective material layers formed on the basis of oxidation and/or deposition techniques followed by sophisticated lithography and etch techniques. Thereafter, the liner 214, if required, may be formed, for instance by oxidation, and subsequently the spacers 213 may be formed by depositing a dielectric layer and anisotropically etching the same. Next, an implantation process 215 may be performed to create the drain and source extension regions 203, wherein respective implantation parameters may be readily established on the basis of simulations, experiments and the like.

Figure 2B:
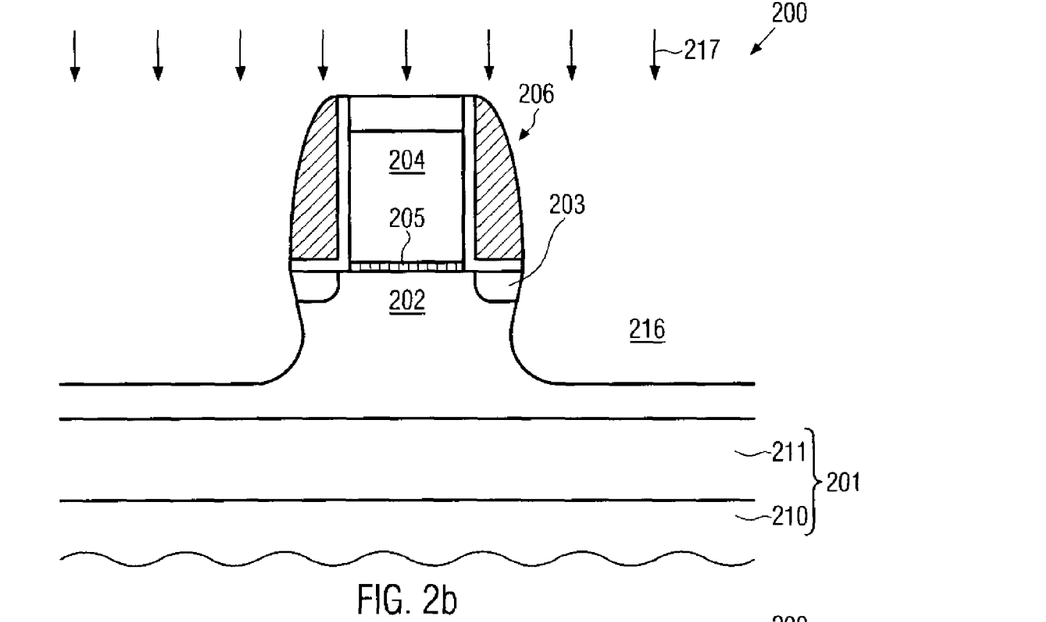

FIG. 2b schematically illustrates the transistor 200 in a further advanced manufacturing stage. A further sidewall spacer structure 206 is formed on sidewalls of the gate electrode 204 according to device requirements, wherein a width of the spacer structure 206 is selected with respect to a masking effect during a subsequent implantation process for forming deep drain and source regions and also with respect to the masking effect during a metal silicide formation process. Furthermore, respective recesses or cavities 216 are formed in the semiconductor layer 202 adjacent to the spacer structure 206. The spacer structure 206 may be formed on the basis of well-established techniques including the conformal deposition of a liner material, if required, such as silicon dioxide and the like, and a subsequent deposition of a spacer material, such as silicon nitride and the like, followed by an anisotropic etch process to remove horizontal portions of the previously deposited spacer layer, wherein the respective liner, if provided, may act as an efficient etch stop layer. It should be appreciated that other device areas, including, for instance, N-channel transistors, may be masked prior to an etch process 217 for forming the recesses 216. The etch process 217 may be performed on the basis of well-established recipes, wherein process parameters, such as the concentration of polymer generators, the directionality of the ion bombardment, the flux density of ions and the like, may be appropriately adjusted in order to obtain a certain degree of under-etching of the spacer structure 206. Moreover, due to the restricted thickness of the layer 202, the etch process 217 is stopped so as to leave a certain amount of crystalline material for a subsequent selective epitaxial growth process.

Figure 2C:
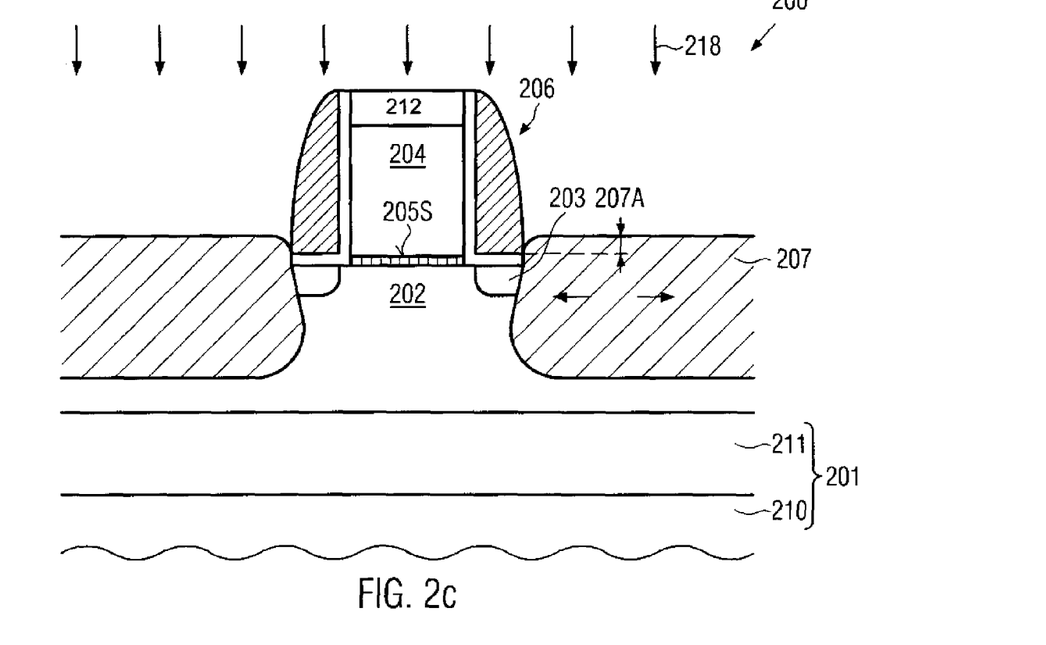

FIG. 2c schematically illustrates the semiconductor device 200 during a selective epitaxial growth process 218 during which a strained silicon/germanium material 207 is grown in the recesses 216. During the epitaxial growth process 218, the gate electrode 204 is reliably covered by the capping layer 212 and the spacer structure 206. In one illustrative embodiment, the selective epitaxial growth process 218 is performed substantially without adding a P-type dopant material, as is for instance the case in conventional techniques, so that the strained silicon/germanium material 207 may be provided as a substantially undoped material. Consequently, the process complexity of the epitaxial growth process 218 may be significantly reduced, since in situ doping of silicon/germanium material at moderately high doping levels may require a precise and stable control of the respective process parameters, such as concentration of precursor and carrier gases in the respective deposition atmosphere, the respective pressure, temperature of the substrate and the like. Moreover, an excess portion 207A may be provided above the strained silicon/germanium material 207, that is, in some embodiments, the strained semiconductor material 207 may extend above a height level as defined by the height level of a top surface 205S of the gate insulation layer 205. In some illustrative embodiments, the excess portion 207A may substantially correspond to an amount of semiconductor material as may be consumed and thus converted into a metal silicide in a later manufacturing stage. In other illustrative embodiments, the excess portion 207A may be provided in the form of a silicon material, thereby providing enhanced flexibility in forming a metal silicide in the portion 207A. In this case, a plurality of well-established silicidation techniques may be used, substantially without being influenced by the presence of the silicon/germanium material 207.

Figure 2D:
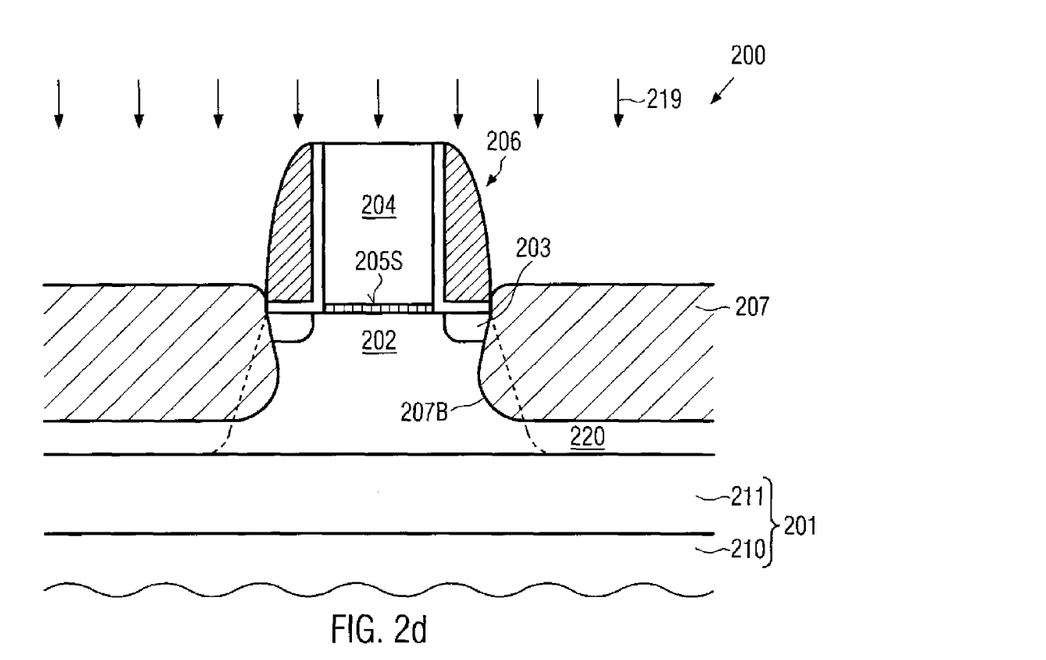

FIG. 2d schematically illustrates the transistor 200 during an implantation process 219 to form highly P-doped deep drain and source regions 220, which may extend down to the buried insulating layer 211. It should be appreciated that the implantation process 219 may be performed on the basis of process parameters so as to maintain at least a portion of the strained silicon/germanium material 207, indicated as 207B, substantially undoped, or respective implantation steps, such as a halo implantation and the like, may be performed in order to create a respective desired N-doped area in the portion 207B. As previously explained, by creating a certain degree of anisotropy during the etch process 217 (FIG. 2b), it is ensured that the portion 207B remains masked during the implantation process 219, wherein the size of the portion 207B may also be adjusted by selecting appropriate tilt angles during the implantation 219, when a reduced size of the portion 207B may be desired. On the other hand, if a more pronounced PN junction is desired in the portion 207B, a respective tilted halo implantation process may be performed with a counter dopant relative to the P-type dopant used for forming the deep drain and source regions 220.

Figure 2E:
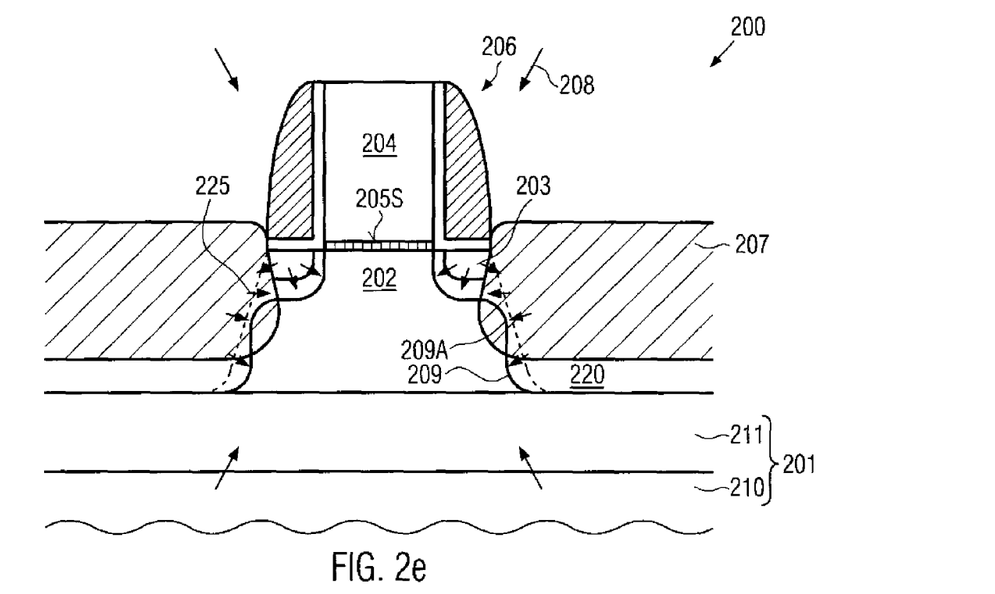

FIG. 2e schematically illustrates the transistor 200 during an anneal process 208 for activating the dopants in the extensions 203 and the deep drain and source regions 220. As is indicated by the arrows 225, the P-type dopants in the regions 203 and 220 are diffusing, while crystalline damage, caused by the implantations 215 (FIG. 2a) and 219 (FIG. 2d), may be substantially re-crystallized. The parameters of the anneal process 208 may be appropriately selected so as to obtain a desired shape of a PN junction 209, wherein a portion thereof, indicated as 209A, is formed within the strained silicon/germanium material. For example, the temperature and the duration of the anneal process 208 may be selected such that the average diffusion length of the P-type dopant is less than a distance between a respective PN junction as deposited during the implantation process 219 and the boundary of the strained silicon/germanium material 207. In this case, the portion 209A of the PN junction 209 is reliably maintained within the strained silicon/germanium material 207. For example, as previously explained, the degree of anisotropy during the formation of the recesses 216, in combination with the implantation parameters of the process 219, may result in a sufficient offset to allow efficient dopant activation and re-crystallization while still maintaining the portion 209A within the material 207. Since the diffusion behavior of P-type dopants in strained silicon/germanium material may be readily investigated and/or calculated, an appropriate set of process parameters may be established on the basis of respective results. Consequently, the area, that is, in the cross-section of FIG. 2e the length, of the portion 209A may be reliably controlled on the basis of the above procedure, thereby also enabling the adjustment of the amount of junction leakage and thus the efficiency of removing accumulated charge carriers from a floating body region that is substantially defined by the finally obtained PN junctions 209. Consequently, the respective drain and source regions 220 may be efficiently formed within a portion of strained silicon/germanium material on the basis of implantation techniques, while at the same time the degree of junction leakage may be controlled in order to significantly reduce floating body effects.

Figure 2F:
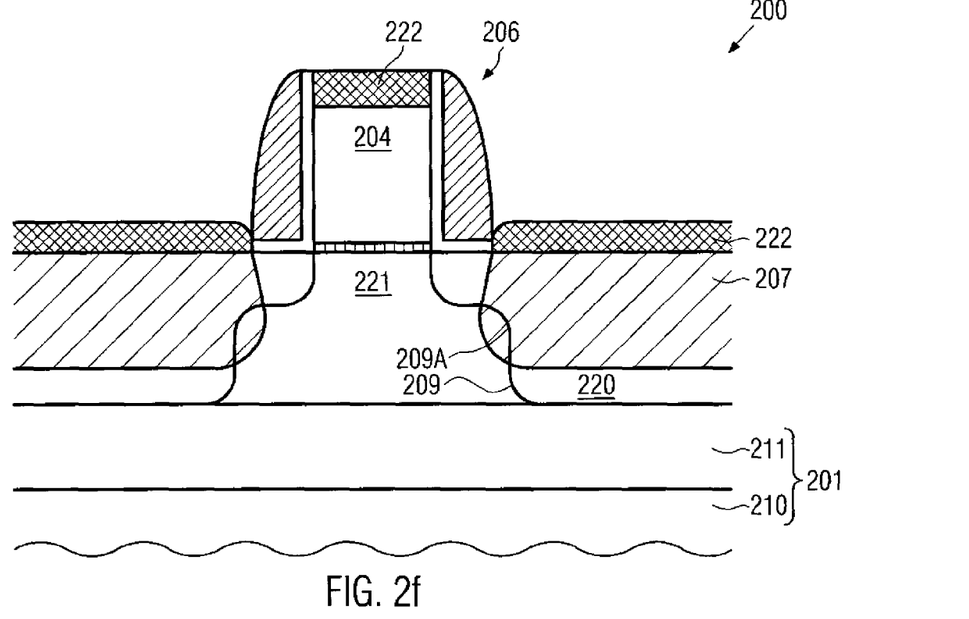

FIG. 2f schematically illustrates the transistor 200 in a further advanced manufacturing stage, wherein metal silicide regions 222 are formed in the excess portion 207A and the gate electrode 204. As previously discussed, depending on the type of material included in the excess portion 207A, an appropriate silicidation technique may be used. For instance, if the excess portion 207A is provided in the form of silicon, any appropriate material, such as platinum, nickel, cobalt or combinations thereof, may be used for the formation of a respective metal silicide. Since the metal silicide 222 is substantially restricted to the excess portion 207A, substantially no strain relaxation may be caused in the region 207, thereby providing an efficient strain generating mechanism within a body region 221.

With reference to FIGS. 3a-3f, further illustrative embodiments of the present invention will now be described in more detail, in which the strained silicon/germanium material is positioned more closely to a gate electrode compared to the embodiments as shown and described with reference to FIGS. 2a-2f.

Figure 3A:
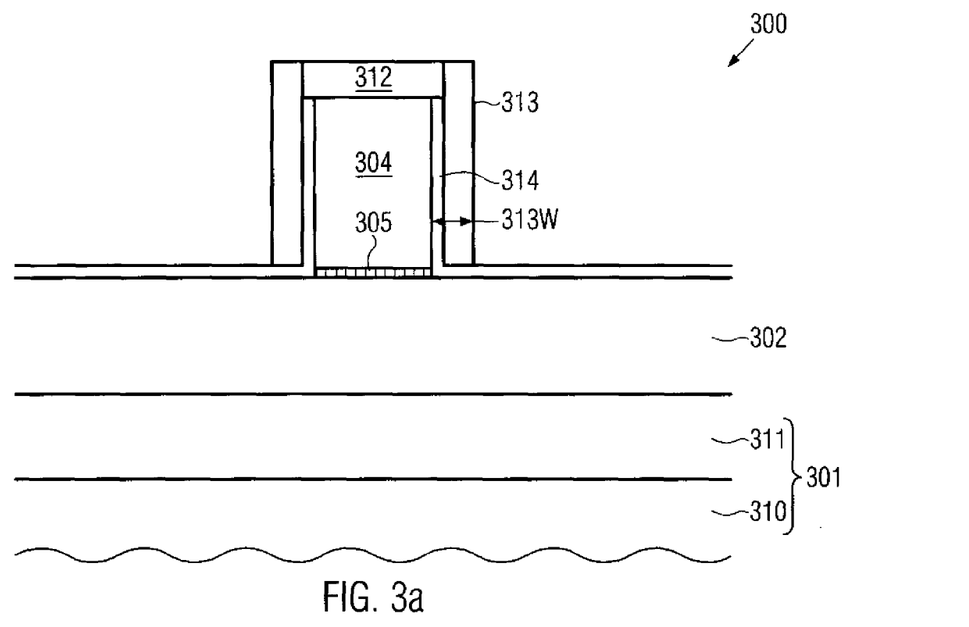
FIGS. 3a-3f schematically illustrate cross-sectional views of an SOI transistor with a floating body region during various manufacturing stages, wherein the strained silicon/germanium material is positioned in close proximity to the channel region on the basis of a disposable spacer in accordance with yet other illustrative embodiments.

In FIG. 3a, a transistor 300 comprises a substrate 301 including a base material 310 and a buried insulating layer 311 having formed thereon a semiconductor layer 302. Regarding the properties of these components, the same criteria apply as previously explained with reference to FIG. 2a. Moreover, in this manufacturing stage, the transistor 300 comprises a gate electrode 304 formed above the semiconductor layer 302 and separated therefrom by a gate insulation layer 305. A capping layer 312 covers a top surface of the gate electrode 304 and a respective spacer structure 313, having a specified width 313W, in combination with a liner 314, provide for an encapsulation of the gate electrode 304. In one illustrative embodiment, a width of the spacers 313 including the liner 314 may be approximately 10 nm or significantly less and may, in some illustrative embodiments, even be approximately 2 nm and less. The transistor 300 as shown in FIG. 3a may be formed on the basis of substantially the same process techniques as previously described with reference to FIG. 2a. It should be appreciated that the spacer structure 313 may be formed on the basis of conformal deposition techniques followed by well-established anisotropic etch processes. The liner 314 may be formed on the basis of an oxidation process.

Figure 3B:
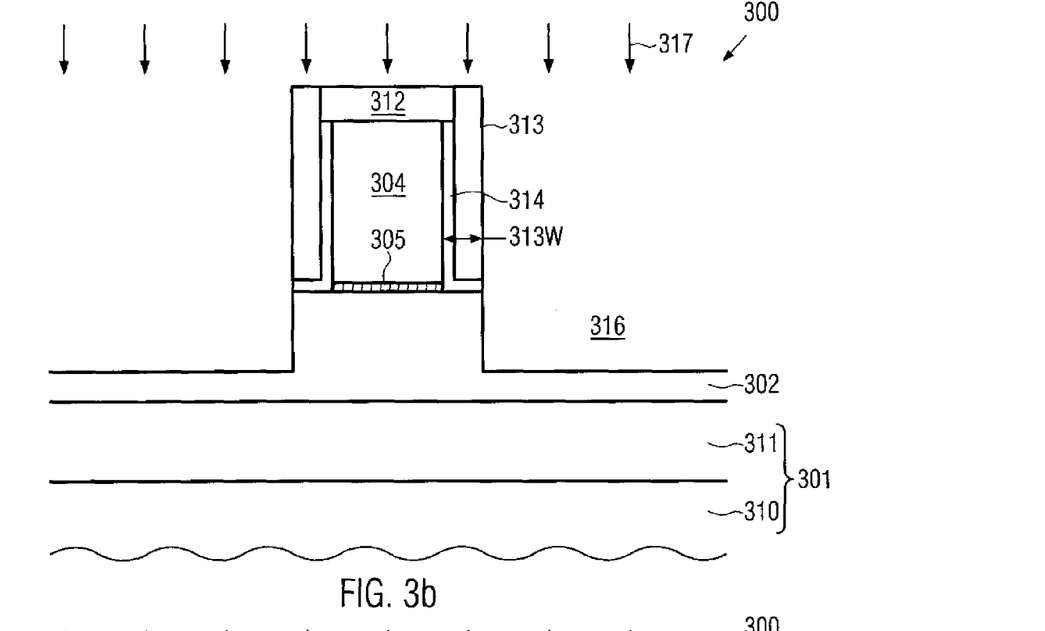

FIG. 3b schematically illustrates the transistor 300 during an etch process 317 for forming respective recesses or cavities 316 in the semiconductor layer 302 adjacent to the spacer structure 313. Depending on the spacer width 313W and desired degree of under-etching, a degree of anisotropy of the etch process 317 may be appropriately controlled. That is, for a low spacer width 313W, the etch process 317 may be designed as a substantially anisotropic etch process in order to substantially avoid an undue etch attack in the vicinity of the gate insulation layer 305. Corresponding etch recipes, which are selective with respect to, for instance, silicon nitride, silicon dioxide and the like, for etching silicon material in a highly anisotropic manner are well-established in the art.

Figure 3C:
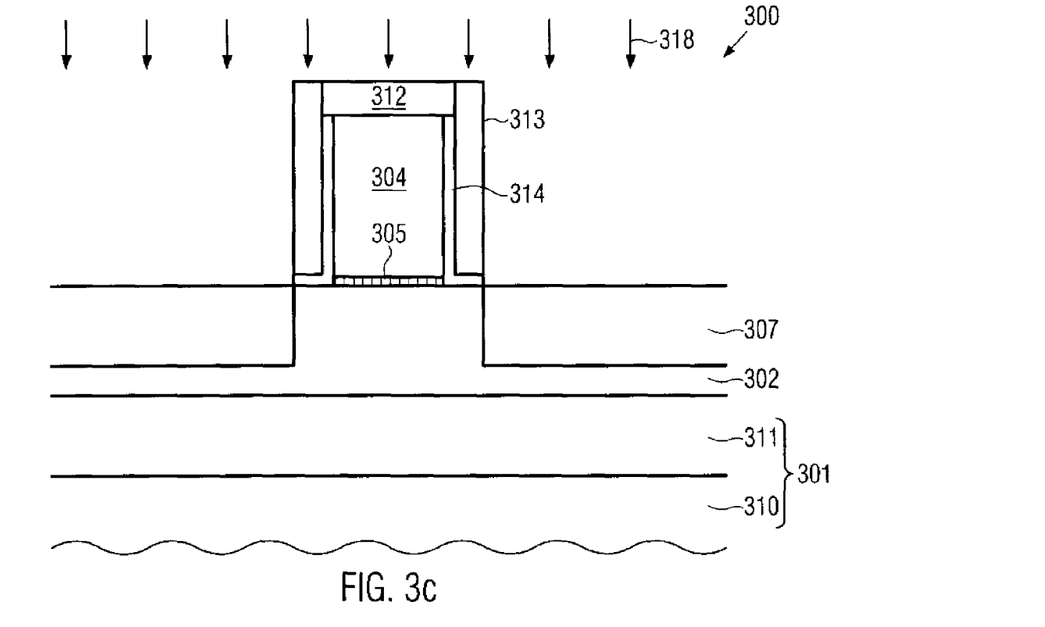

FIG. 3c schematically illustrates the transistor 300 during a selective epitaxial growth process 318 for forming a strained silicon/germanium material 307 in the recesses 316. During the epitaxial growth process 318, non-doped silicon/germanium material may be grown, thereby relaxing the constraints with respect to process control compared to conventional strategies including the in situ doping, as is previously explained. Moreover, in one illustrative embodiment, the strained silicon/germanium material 307 may be formed up to a height level defined by the gate insulation layer 305, since an extra height for accommodating a metal silicide may not be required, as will be discussed later on. Thereafter, the spacers 313 and the capping layer 312 may be selectively removed, for instance on the basis of highly selective wet chemical etch recipes based on hot phosphoric acid when the capping layer 312 and the spacers 313 are substantially comprised of silicon nitride.

Figure 3D:
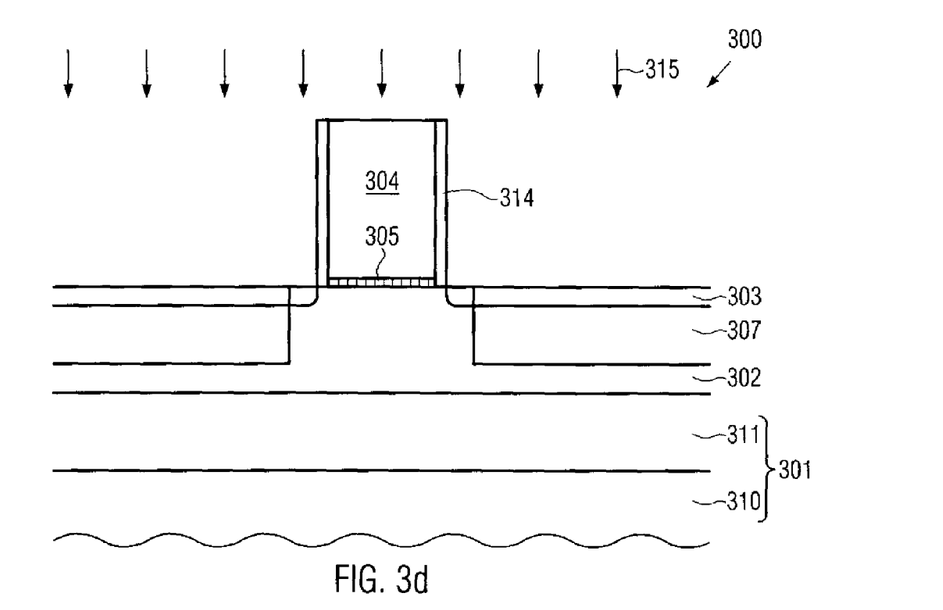

FIG. 3d schematically illustrates the transistor 300 during an implantation process 315 for forming respective extension regions 303 in the layer 302 and in a portion of the strained silicon/germanium material 307. Depending on the required offset of the extension regions 303 with respect to the gate electrode 304, additional offset spacers (not shown) may be formed on sidewalls of the gate electrode 304.

Figure 3E:
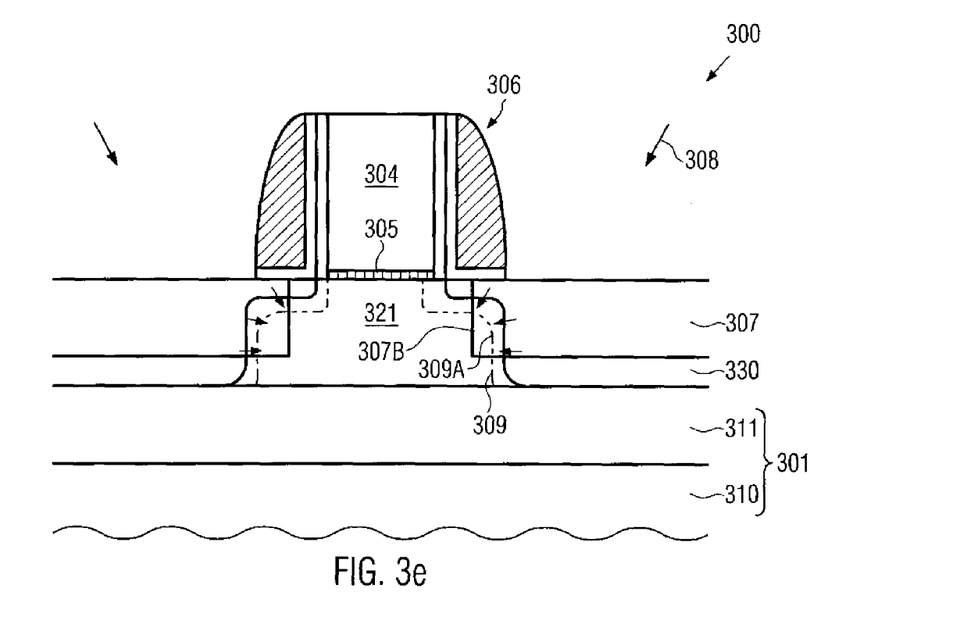

FIG. 3e schematically illustrates the transistor 300 in a further advanced manufacturing stage. Here, the gate electrode 304 has formed thereon a further spacer structure 306, which may include any appropriate number of individual spacer elements and respective liner materials, if required, to provide the desired lateral and vertical profiling of deep drain and source regions 320. For this purpose, the device 300 is exposed to an implantation process for introducing a P-type dopant with the required high dopant concentration. It should be appreciated that the formation of the spacer structure 306 and performing the individual steps of the implantation process may be carried out intermittently if a more complex lateral profiling of the deep drain and source regions 320 is required. In the example shown, a single spacer element may be provided in the spacer structure 306, which may be formed on the basis of well-established spacer techniques, and thereafter the implantation may be performed to obtain the deep drain and source regions 320 as shown. Next, an anneal process 308 may be performed on the basis of appropriately selected process parameters, such as duration, temperature and type of heat transfer, in order to appropriately re-crystallize implantation-induced damage and also activate dopants introduced by the implantation processes. It should be appreciated that in other illustrative embodiments the extension regions 303 may be separately annealed after the implantation 315 and prior to the formation of the deep drain and source regions 320, depending on the process strategy. Furthermore, as previously explained with reference to the device 200, other implantation processes, such as a halo implantation and the like, may be performed prior to or after the implantation 315 and prior to the implantation process for forming the drain and source regions 320.

As previously explained, the diffusivity of the respective P-type dopant material may be determined in advance in order to appropriately select respective anneal parameters, wherein, in this case, a significantly increased portion 307B of substantially non-doped or counter-doped strained silicon/germanium material may be provided, due to a formation of the respective cavities 316 close to the gate electrode 304. Hence, during the anneal process 308, diffusion of the P-type dopant is initiated so as to finally form respective PN junctions 309 of which a significant portion 309A is located within the strained silicon/germanium material 307. Consequently, the device 300 comprises a floating body region 321, a portion of which, i.e., the portion 307B, is comprised of strained silicon/germanium material that is closely located to an area of the body region 321, in which a channel may form upon operation of the device 300. Consequently, due to the close proximity of the strained silicon/germanium material to the respective channel portion of the body region 321, a respective strain therein may be obtained in a highly efficient manner. Furthermore, the process strategy as described above may result in a significantly increased portion 307B and thus in an increased portion 309A of the PN junction 309 that is located within the strained silicon/germanium material. Consequently, an increased junction leakage is obtained, thereby further reducing any floating body effects. Thus, the device 300 may provide increased drive current capability in combination with reduced floating body effects.

The size of the portion 309A may be readily controlled on the basis of the etch process 317 and thus on the basis of the width 313W as well as on the further lateral profiling of the deep drain and source regions 320, which may be accomplished by using one or more spacer elements in combination with a respective implantation process. Furthermore, appropriate anneal process parameters may be used to also control the degree of out-diffusion of P-type dopants in order to obtain the desired size of the portion 309A. For instance, in some illustrative embodiments, sophisticated anneal techniques may be used, in which laser-based or flash-based processes may be employed, in which short duration pulses of radiation are irradiated on the device 300 to heat the semiconductor layer 302 in a very localized manner. Hence, a high degree of dopant activation may be achieved, while dopant diffusion is significantly reduced due to the short duration of the activation process. On the other hand, implantation-induced damage may be re-crystallized, if required, by performing a heat treatment at reduced temperatures in a range of approximately 600-800° C. In this way, a diffusion of dopant material may be significantly reduced while nevertheless a high degree of lattice re-crystallization may be achieved. It should be noted that corresponding advanced anneal techniques may also be efficiently used in combination with the embodiments described with reference to FIGS. 2a-2e.

Figure 3F:
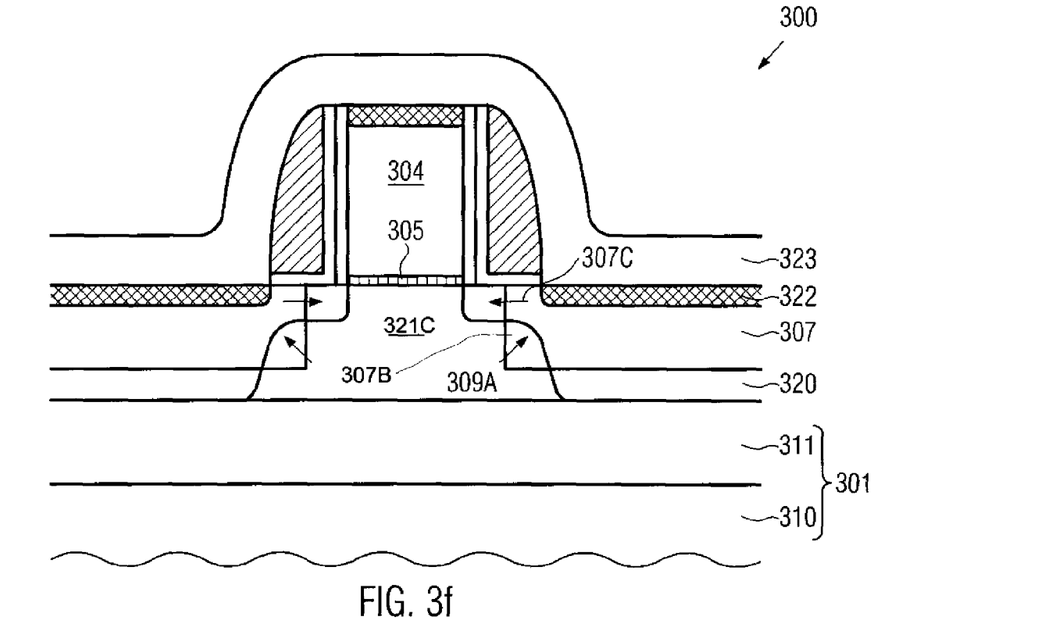

FIG. 3f schematically illustrates the transistor 300 in a further advanced manufacturing stage. In this stage, the transistor 300 further comprises metal silicide regions 322 formed in an upper portion of the strained silicon/germanium material 307 and within the gate electrode 304. As previously explained, the metal silicide 322 may be formed within the material 307 without providing an excess portion, since strained silicon/germanium material is still present in a portion 307C, thereby providing an efficient strain-inducing mechanism in a channel region 321C located below the gate insulation layer 305. In some illustrative embodiments, the transistor 300 may further comprise a compressively stressed overlayer 323, which may, for instance, be comprised of silicon nitride, which may be formed with high compressive stress on the basis of plasma enhanced chemical vapor deposition (PECVD) techniques, thereby further enhancing the strain in the channel region 321C. Moreover, due to the substantially planar configuration of the metal silicide regions 322 with respect to the gate insulation layer 305, a more efficient stress transfer from the overlayer 323 into the channel region 321C may be accomplished, compared to a design as shown in FIGS. 1 and 2f, in which a substantially relaxed metal silicide portion would reduce the effectiveness of the stress transfer through the corresponding sidewall spacer structure. Consequently, the configuration as shown in FIG. 3f provides high drive current capability due to a very efficient strain-generating mechanism on the basis of the strained portion 307C and the enhanced stress transfer mechanism obtained by the overlayer 323, while additionally a well-controllable and increased size of the PN junction 309A provides high junction leakage and thus significantly reduced potential variations of the floating body region 321.

With reference to FIGS. 4a-4e, further illustrative embodiments of the present invention will now be described in more detail, in which implantation techniques and epitaxial growth techniques with in situ doping may be combined to reduce implantation-induced damage in the strained silicon/germanium material.

Figure 4A:
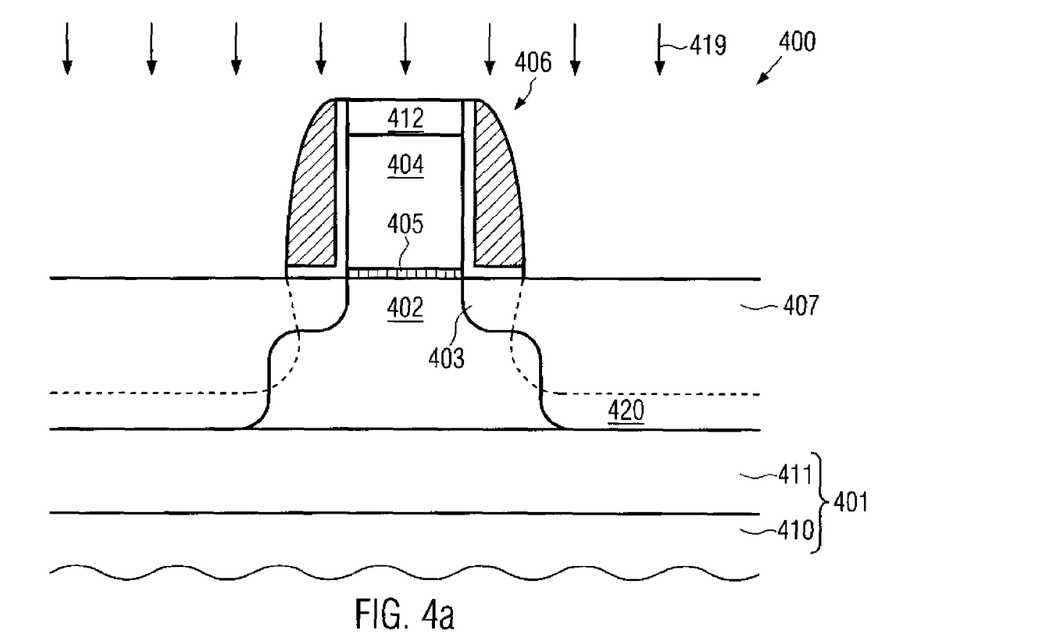
FIGS. 4a-4e schematically illustrate cross-sectional views of an SOI transistor with a floating body region, in which a portion of the PN junctions is located within strained silicon/germanium material on the basis of in situ doping and an appropriate anneal process according to further illustrative embodiments of the present invention.

In FIG. 4a, an SOI transistor 400 may comprise a substrate 401 including a base material 410 and a buried insulation layer 411, wherein a semiconductor layer 402 is formed on the buried insulating layer 411. Moreover, a gate electrode 404 may be formed on a gate insulation layer 405 and may comprise a sidewall spacer structure 406 and a capping layer 412. Furthermore, in this manufacturing stage, an extension region 403 may be formed in the semiconductor layer 402. Regarding the various components and any process techniques for forming the same, it may be referred to the embodiments as previously described with reference to FIGS. 2a-2f. Moreover, in one exemplary embodiment, the transistor 400 may be exposed to an implantation process 419 for forming deep drain and source regions 420.

Hereby, implantation parameters are selected so that the corresponding deep drain and source regions 420 may extend below a desired etch depth, as indicated by the dashed lines, for forming respective recesses or cavities that are subsequently filled with strained silicon/germanium material.

Figure 4B:
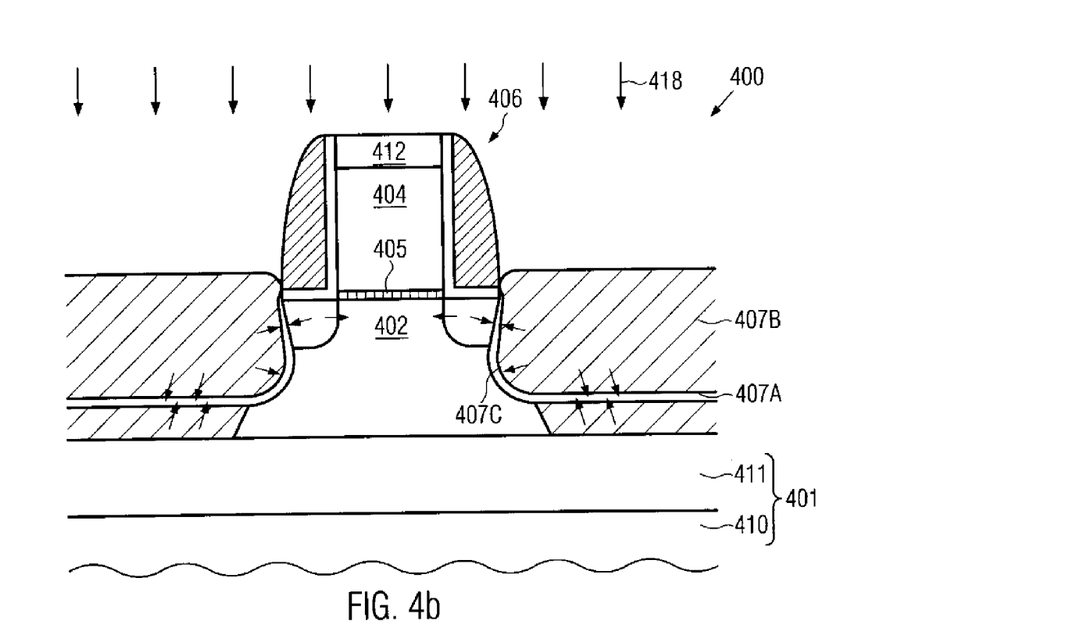

FIG. 4b schematically illustrates the transistor 400 in an advanced manufacturing stage, in which a selective epitaxial growth process 418 is performed, wherein, in a first phase of the process 418A, substantially non-doped strained silicon/germanium material 407A is grown and subsequently an appropriate dopant precursor material is added to the deposition atmosphere in order to provide a second strained silicon/germanium material 407B including a high concentration of the P-type dopant material. As previously explained, especially the first phase for forming the substantially undoped strained material 407A may be controlled with high precision due to the intrinsic nature of the silicon/germanium material. Consequently, a region 407C of the second strained silicon/germanium material 407B is provided, in which a high P-type dopant concentration is provided next to the non-doped material 407A, while, in adjacent areas, the non-doped material 407A is located next to the neighboring silicon material of the semiconductor layer 402 with substantially no P-type dopant material. Thus, near the bottom of the deep drain and source regions 420, as well as near the interface between the extension regions 403 and the second strained silicon/germanium material 407B, the corresponding non-doped material 407A is enclosed from both sides by highly P-doped semiconductor material, while in the area between the deep drain and source regions 420 and the extensions 403 in the region 407C, only one "neighbor" of the intrinsic portion 407A contains a high P-type dopant concentration (i.e., the second strained silicon/ germanium material 407B). Consequently, during a subsequent anneal process, an increased diffusion activity into the non-doped material 407A corresponding to the extensions 403 and bottom portions of the deep drain and source regions 420 may be achieved, while a significantly reduced diffusion activity is obtained in the vicinity of the portion 407C. As a result, in the vicinity of the extension regions 403 and the deep drain and source regions 420, the increased dopant diffusion may "bridge" the substantially undoped portions 407A, while in the vicinity of the portion 407A a respective PN junction may be established within the substantially non-doped portion 407A. It should be appreciated that an appropriate parameter selection for the process 418, that is, for a thickness of the substantially non-doped portion 407A, in combination with appropriately selected anneal parameters may enable a reliable formation of a portion of a PN junction within the strained silicon/germanium material.

Figure 4C:
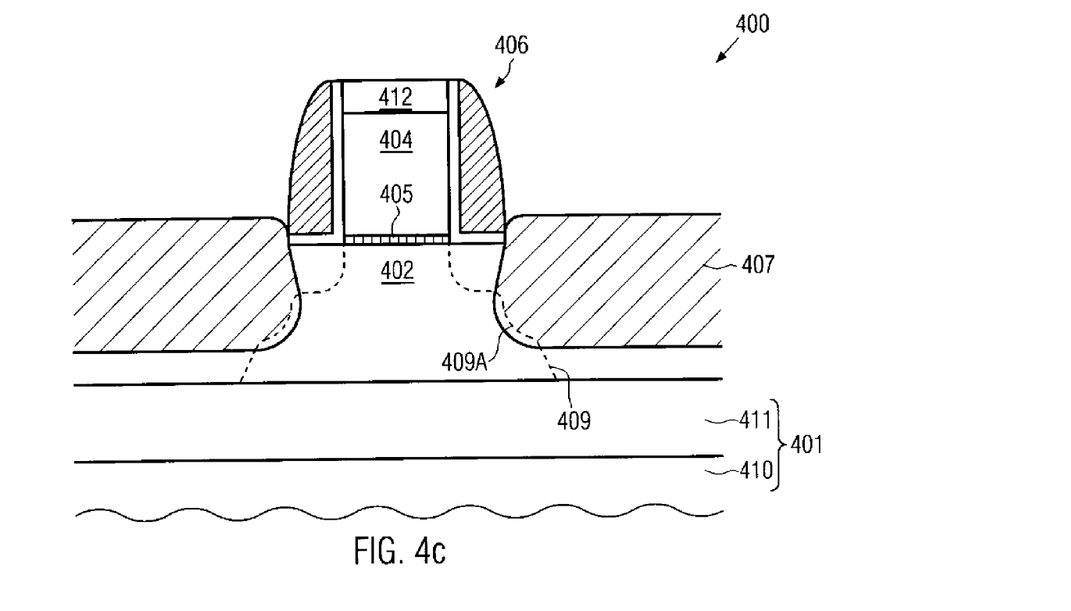

FIG. 4c schematically illustrates the transistor 400 after the completion of the above-described anneal process. Hence, the corresponding deep drain and source regions 420 may now continuously extend down to the buried insulating layer 411 and also the extension regions 403 may connect to the deep drain and source regions 420, thereby forming the respective PN junction 409, while still a portion thereof, indicated as 409A, is located within the strained silicon/germanium material 407A/407B. It should be appreciated that, in other illustrative embodiments, when an increased junction capacitance is less critical, the implantation 419 may be omitted and the resulting junction 409 may be obtained substantially completely within the substantially non-doped region 407A after the respective anneal process.

Figure 4D:
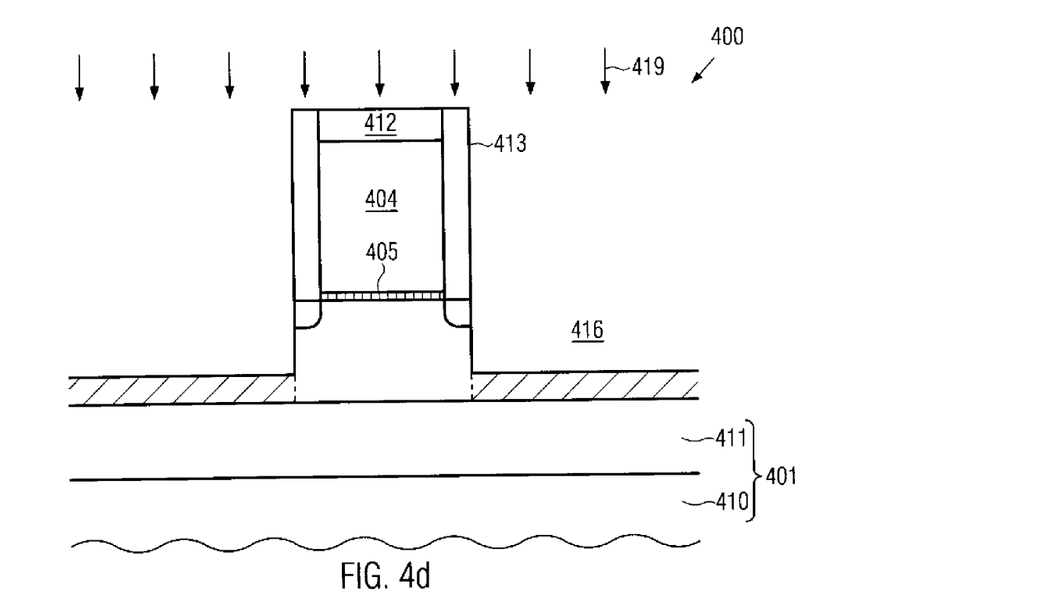

FIG. 4d schematically illustrates a transistor 400 according to a further illustrative embodiment in which respective recesses 416 may have been formed adjacent to the gate electrode 404 on the basis of appropriately designed spacers 413 so as to obtain a reduced offset of the recess 416 with respect to the gate electrode 404. Moreover, at an earlier manufacturing stage, the extension regions 403 may have been formed, when a corresponding implantation process in a later stage, after the formation of the epitaxially grown silicon/germanium material, is considered inappropriate. Moreover, the implantation 419 may be performed at this stage, thereby introducing a P-type dopant in the remaining portion of the semiconductor layer 402, wherein a reduced dopant concentration and reduced implantation energy may result in a significantly reduced degree of crystal damage in the remaining silicon portion. In other illustrative embodiments, the implantation 419 may be performed prior to a corresponding etch process, as is previously described with reference to FIG. 4a. Thereafter, a corresponding epitaxial growth process as previously described with reference to the process 418 may be performed.

Figure 4E:
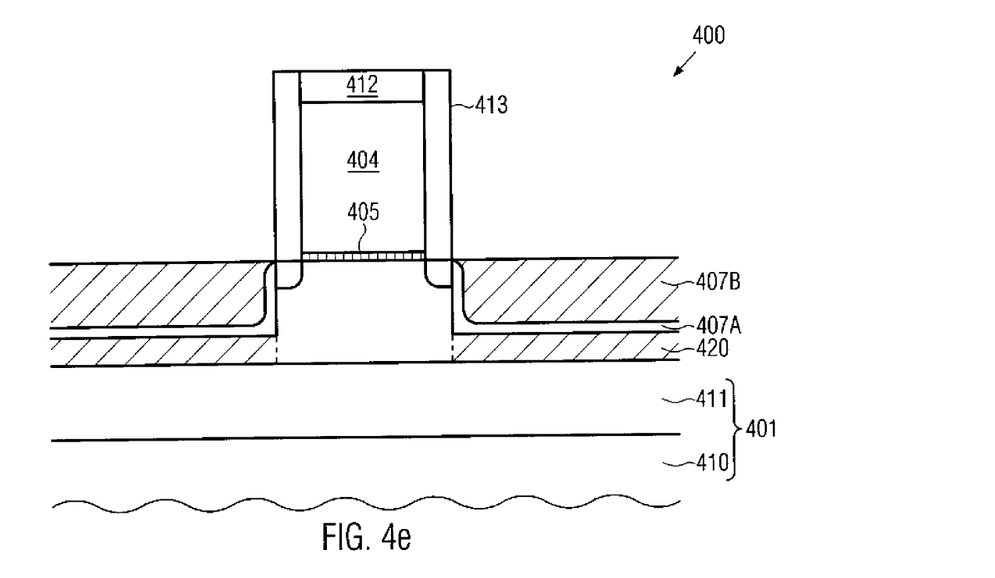

FIG. 4e schematically illustrates the transistor 400 after the completion of the respective epitaxial growth process. Hence, a substantially undoped silicon/germanium material 407A is formed above the deep drain and source regions 420 followed by the highly in situ doped material 407B. Thereafter, a corresponding anneal process may be carried out to form the respective drain and source regions and the respective PN junctions 409, as is previously explained, wherein a portion of the respective PN junctions also remains located within the strained silicon/germanium material 407A, 407B. Thereafter, the further processing may be continued by removing the respective spacers 413 and the capping layer 412 and forming an additional sidewall spacer for the subsequent silicidation process. Consequently, the embodiments described above with reference to FIGS. 4a-4e provide a strained silicon/germanium material, wherein a portion of the respective PN junctions is located in the silicon/germanium material, while implantation-induced damage in the strained silicon/germanium material may be significantly reduced due to a combined epitaxial growth process for forming a substantially intrinsic and a highly doped strained semiconductor material.

As a result, the present invention provides an improved technique for the formation of SOI transistors with a floating body region, in which a highly efficient strain-inducing mechanism is combined with increased junction leakage to significantly reduce floating body effects. For this purpose, in some aspects, implantation processes may be used instead of in situ doping of the strained silicon/germanium material, thereby providing a high degree of flexibility in designing the respective PN junctions, wherein it is reliably ensured that a portion thereof is within the strained semiconductor material, thereby providing the desired increased junction leakage. For example, in embodiments as described with reference to FIGS. 3a-3f, an increase of junction leakage up to six orders of magnitude compared to the conventional integration scheme as shown in FIG. 1 for otherwise identical transistor parameters may be obtained. The embodiments as described with reference to FIGS. 2a-2f may also provide a significant increase of the junction leakage of approximately up to two orders of magnitude compared to the conventional integration scheme. Additionally, the strained semiconductor material may be positioned close to the gate electrode, wherein an offset of approximately 2 nm and even less may be achieved, thereby also enhancing the strain in the respective channel region which correspondingly translates into a respective increase of the drive current capability. In other aspects, implantation, in situ doping and intrinsic epitaxial growth of the strained silicon/germanium material may be combined to reduce the overall defect rate in the strained semiconductor material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a recess adjacent to a gate electrode structure including a sidewall spacer within a semiconductor layer formed on a buried insulating layer;
   introducing a P-type dopant into said semiconductor layer at a bottom surface thereof after forming said recess;
   forming a first strained silicon germanium material in said recess after introducing said P-type dopant, wherein said first strained silicon germanium material is a substantially undoped material;
   forming a second strained silicon germanium material on said first strained silicon germanium material, said second strained silicon germanium material comprising a P-type dopant introduced during the forming of the second strained silicon germanium material;
   forming drain and source extension regions adjacent to said gate electrode structure by an ion implantation process; and performing an anneal process for defining respective PN junctions with a floating body region to cause said P-type dopant in said semiconductor layer at said bottom surface and said P-type dopant in said second strained silicon germanium material to diffuse into said first strained silicon germanium material to define a first portion of said PN junctions located within said first strained silicon germanium material and spanning between said second strained silicon germanium material and said bottom surface, and wherein a second portion of said PN junctions is located within one of said first or second strained silicon germanium materials.

2. The method of claim 1, further comprising forming excess semiconductor material on said second strained silicon germanium material to obtain a height level that extends above a height level defined by a gate insulation layer formed between said gate electrode and said semiconductor layer.

3. The method of claim 2, wherein said excess semiconductor material is formed as a strained silicon germanium material.

4. The method of claim 2, wherein said excess semiconductor material is formed as a silicon material.

5. The method of claim 1, wherein said strained silicon germanium material is formed in said recess up to a height level that is equal to or lower than a height level as defined by a gate insulation layer formed between said gate electrode and said semiconductor layer.

6. The method of claim 1, wherein said portion of said PN junctions located within said silicon germanium material comprises a vertical portion.

7. The method of claim 1, wherein forming said drain and source extension regions comprises forming said drain and source extension regions prior to forming said recess.

8. The method of claim 7, wherein said drain and source extension regions comprises P-type dopant, and performing the anneal further comprises performing the anneal to cause said P-type dopant in said drain and source extension regions and said P-type dopant in said second strained silicon germanium material to diffuse into said first strained silicon germanium material near said drain and source extension regions to define a third portion of said PN junctions located within said second strained silicon germanium material and spanning between said first strained semiconductor material and said drain and source extension regions.

* * * * *